(12) United States Patent
Doynov et al.

(10) Patent No.: US 11,558,036 B2
(45) Date of Patent: Jan. 17, 2023

(54) MULTI-PASS NONLINEAR NETWORK FOR MICROWAVE GENERATION

(71) Applicant: The Curators of the University of Missouri, Columbia, MO (US)

(72) Inventors: Plamen Doynov, Kansas City, MO (US); Anthony Caruso, Kansas City, MO (US)

(73) Assignee: The Curators of the University of Missouri, Columbia, MO (US)

(*) Notice: Subject to any disclaimer, the term of this patent is extended or adjusted under 35 U.S.C. 154(b) by 0 days.

(21) Appl. No.: 17/455,026

(22) Filed: Nov. 16, 2021

(65) Prior Publication Data

US 2022/0385276 A1 Dec. 1, 2022

Related U.S. Application Data

(60) Provisional application No. 63/114,571, filed on Nov. 17, 2020.

(51) Int. Cl.
*H03H 11/02* (2006.01)
*H02J 1/00* (2006.01)

(52) U.S. Cl.
CPC ............ *H03H 11/02* (2013.01); *H02J 1/00* (2013.01)

(58) Field of Classification Search
CPC ............ H02J 1/00; H03H 11/02; H03H 11/28
USPC ................................................. 307/106, 108
See application file for complete search history.

(56) References Cited

U.S. PATENT DOCUMENTS

| 9,900,203 B1 | 2/2018 | London et al. |
| 10,666,198 B2 | 5/2020 | Prager et al. |
| 2010/0007426 A1* | 1/2010 | Ricketts ............... H03L 7/099 331/107 T |

\* cited by examiner

*Primary Examiner* — William Hernandez
(74) *Attorney, Agent, or Firm* — Stinson LLP

(57) ABSTRACT

A class of design topologies in the field of nonlinear networks (NLN) or nonlinear transmission lines (NLTL) that re-utilize direct current (DC) and low-frequency (LF) signal content reflected from a load or an output filter to yield increased pulse to radio frequency conversion efficiency and increased overall system efficiency. A nonlinear transmission line topology comprises a plurality of series inductive elements and a plurality of nonlinear capacitive elements. The inductive elements and the capacitive elements are arranged in a periodic structure forming a nonlinear network. An output coupling circuit connected across an output of the nonlinear network is configured to transmit high-frequency content to a load and to reflect back direct current and low-frequency content into the nonlinear network.

23 Claims, 6 Drawing Sheets

MULTI-PASS NONLINEAR NETWORK FOR MICROWAVE GENERATION

CROSS-REFERENCE TO RELATED APPLICATION

This application claims the benefit of U.S. Provisional Patent Application No. 63/114,571, filed Nov. 17, 2020, the entire disclosure of which is incorporated by reference for all purposes.

STATEMENT REGARDING FEDERALLY SPONSORED RESEARCH OR DEVELOPMENT

This invention was made with government support under grants N00014-18-C-1017 awarded by the Office of Naval Research. The government has certain rights in the invention.

BACKGROUND

Radio frequency (RF) generation systems comprise elements that transfer and/or convert electrical-to-electrical or electrical-to-electromagnetic energy. The system efficiency of a radio frequency generation system is the product of conversion efficiencies within each component and at each system interface. Basic component categories of an RF generating system are: (a) electrical driver, which accelerates charge within an antenna; and (b) electromagnetic radiator, which converts and transforms energy and impedance. The ability to generate high-power microwave (HPM) frequency energy is of great interest and has multiple applications. The efficiency of the HPM generation system is critical.

U.S. Pat. No. 10,666,198 discloses high-frequency electromagnetic radiation generation using a device that includes a high voltage input, a nonlinear transmission line, an antenna, and a pulse recirculating circuit. The disclosed design, however, has a very long nonlinear transmission line (NLTL) and reported maximum efficiency of approximately 12%.

U.S. Pat. No. 9,900,203 discloses the use of nonlinear modules for generating high power pulses including means for lowering the direct current (DC) content of the generated signal. But such disclosure is limited to the use of photoconductive semiconductor switches and the modules generate out-of-band, lower frequency content with spectral magnitude that is several times higher than that of the higher frequency content.

SUMMARY

Aspects of the disclosure relate to a novel topology in the fields of nonlinear networks (NLN) and nonlinear transmission lines (NLTL). In particular, aspects relate to classes of design topologies of electrical drivers that improve radio frequency (RF) efficiency generation and overall system efficiency by increasing pulse-to-RF conversion.

In an aspect, a NLTL topology comprises a plurality of series inductive elements and a plurality of nonlinear capacitive elements. The inductive elements and the capacitive elements are arranged in a periodic structure forming a NLN. For clarity and simplicity, the inductive and the capacitive elements are drawn without their parasitic internal resistance, parasitic capacitance and parasitic inductance of the physical components. An output coupling circuit connected across an output of the NLN is configured to transmit high-frequency content to a load (e.g., a transmitting antenna) and to reflect back direct current and low-frequency content into the NLN.

A method of improving RF conversion in a NLTL embodies further aspects of the present disclosure. The NLTL includes a plurality of series inductive elements and a plurality of nonlinear capacitive elements that are arranged in a periodic structure forming a NLN. The method comprises connecting an output coupling circuit across an output of the NLN, coupling the NLN to a load, and transmitting, via the output coupling circuit, high-frequency content of an RF signal from the output of the NLN to the load (e.g., a radiating antenna). The method also comprises reflecting, via the output coupling circuit, direct current and lower frequency content from the load back into the NLN.

In another aspect, an RF generation system comprises a plurality of series inductive elements and a plurality of shunt nonlinear capacitive elements. The inductive elements and the capacitive elements are arranged in a periodic structure forming a NLTL. An excitation source is configured to provide an excitation pulse waveform, which has high-frequency content and low-frequency content, to an input of the NLTL. The system also comprises an output coupling circuit connected across an output of the NLTL. The output coupling circuit is configured to transmit the high-frequency content to a load and to reflect back the low-frequency content into the NLTL. In general, the load is a radiating antenna has a complex impedance with resistance, capacitance and inductance and with a given bandwidth.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Nonlinear networks (NLN), nonlinear transmission lines (NLTL), and the like are typically constructed with lumped or distributed elements (e.g., inductors L and capacitors C) that are used to change an input waveform (e.g., sharpening the rising edge, soliton formation, shock-wave generation) in order to control the characteristics of the resulting output waveform. Examples of output characteristics include rise time, pulse width, and number of pulses in the time domain and bandwidth and center frequencies in the frequency domain. The changes of the input waveform (i.e., an excitation input signal) are based on nonlinear dependence of the materials or components with which the networks are built. In the case of a NLN whose component capacitance is derived from a reversely-biased semiconductor junction capacitance (e.g., varactor, Schottky diode), the capacitance of the diode junction is altered nonlinearly when biased or poled with reverse polarity.

Figure 1:
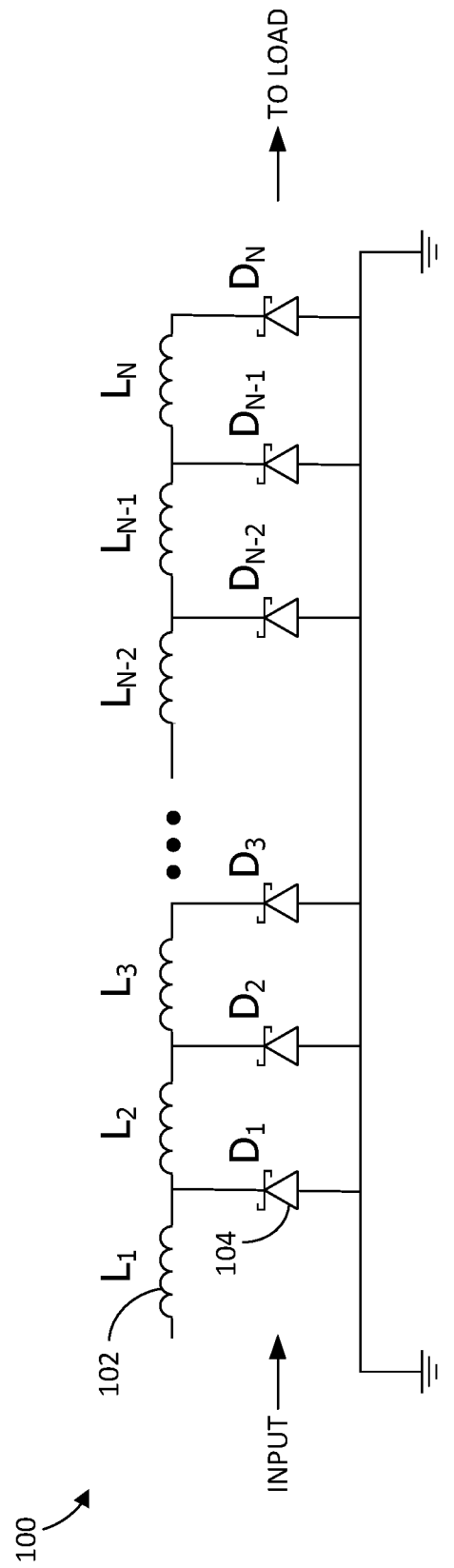
FIG. 1 is a circuit diagram of a diode nonlinear transmission line (NLTL) according to an embodiment.

FIG. 1 is a circuit diagram of a diode NLTL 100 according to an embodiment. As shown, the NLTL 100 comprises a plurality of inductive elements 102, labeled $L_1$ to $L_N$, and a plurality of nonlinear capacitive elements 104, labeled $D_1$ to $D_N$. In the illustrated embodiment, the inductive elements 102 comprise inductors electrically connected in series and the capacitive elements 104 comprise shunt-connected diodes (e.g., Schottky diodes). The inductive elements 102 and capacitive elements 104 are arranged in a periodic structure forming a NLN, specifically NLTL 100. As indicated, NLTL 100 connects to a load (e.g., the next circuit in a particular configuration).

Figure 2:
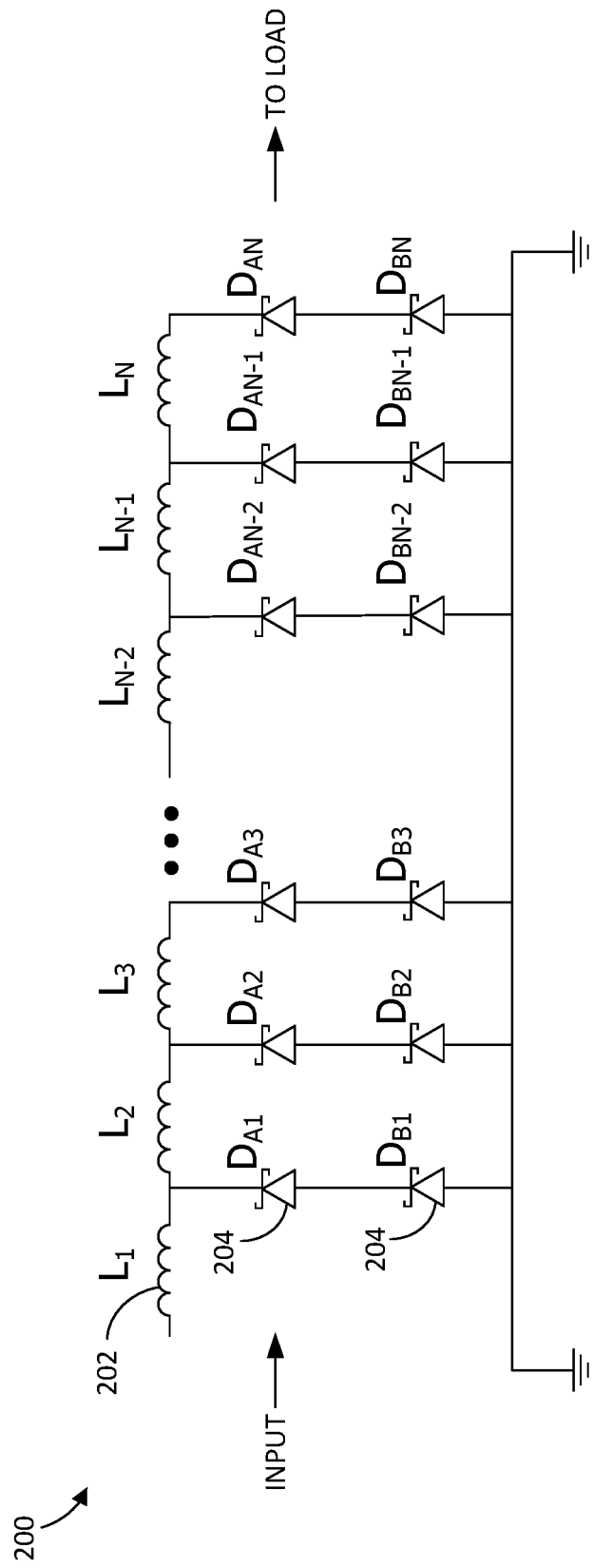
FIG. 2 is a circuit diagram of a diode NLTL having stacked capacitive elements according to an embodiment.

FIG. 2 is a circuit diagram of a diode NLTL 200 according to another embodiment. In this embodiment, the NLTL 200 has stacked capacitive elements. As shown, the NLTL 200 comprises a plurality of inductive elements 202, labeled $L_1$ to $L_N$, and a plurality of nonlinear capacitive elements 204, labeled $D_{A1}$ to $D_{AN}$ and $D_{B1}$ to $D_{BN}$. The inductive elements 202 comprise inductors electrically connected in series and the capacitive elements 204 comprise shunt-connected stacked diodes (e.g., pairs of Schottky diodes connected in series). The inductive elements 202 and capacitive elements 204 are arranged in a periodic structure forming a NLN, specifically NLTL 200. As indicated, NLTL 200 connects to a load (e.g., the next circuit in a particular configuration).

Figure 3A:
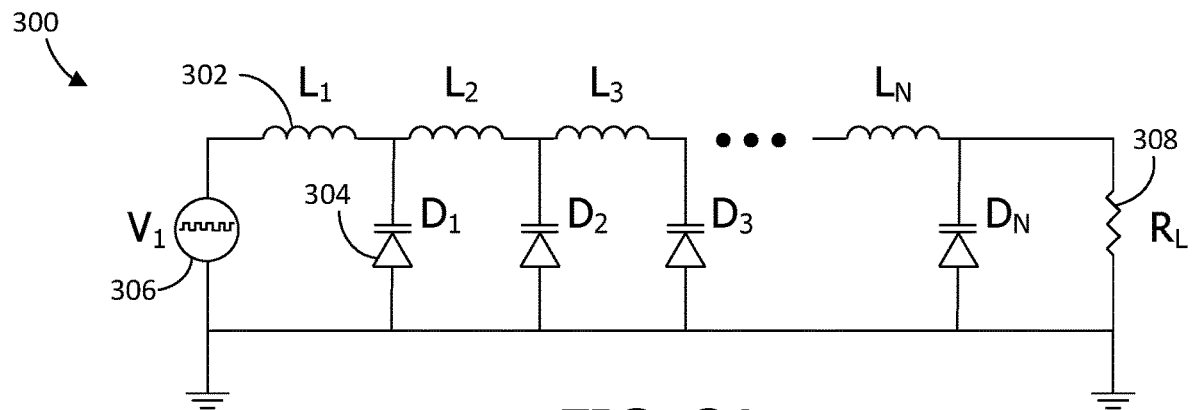
FIGS. 3A-3D are circuit diagrams of diode NLTLs according to alternative embodiments.
Figure 3B:
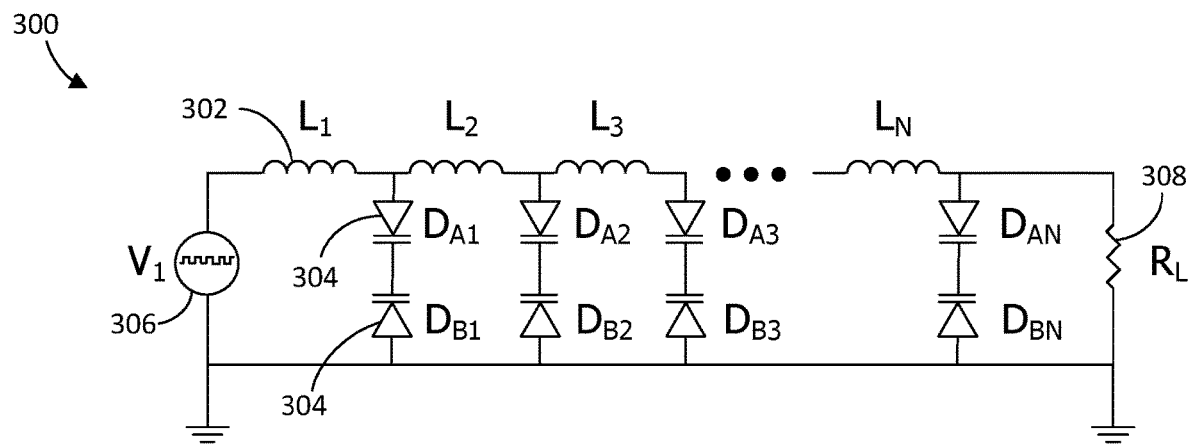
Figure 3C:
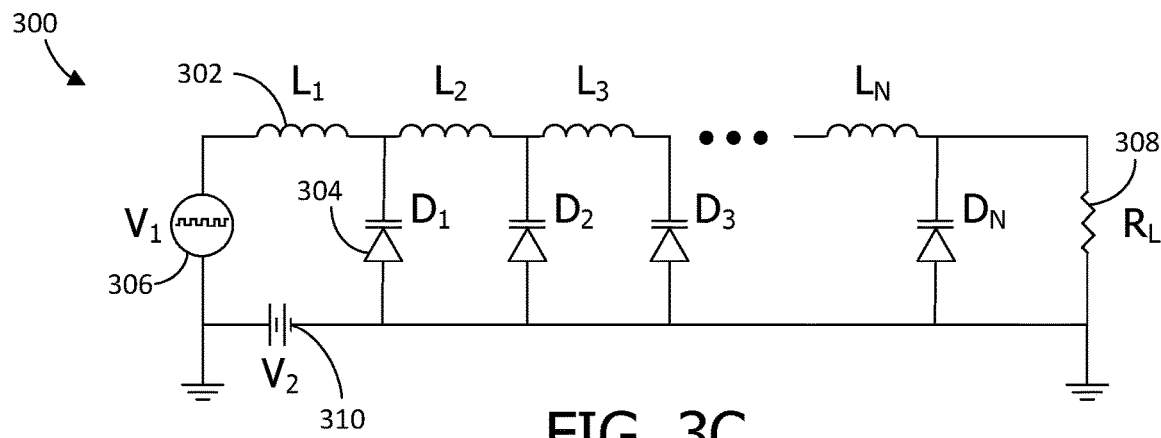
Figure 3D:
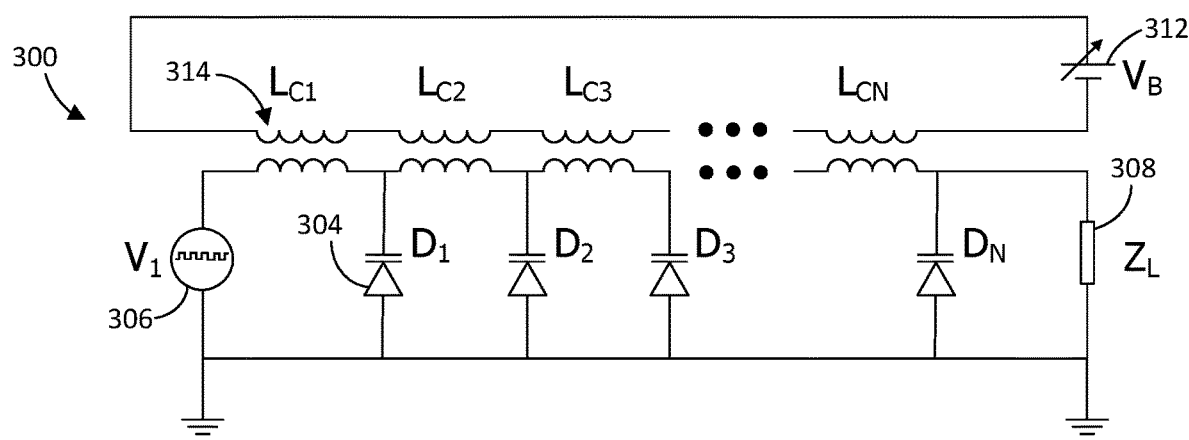

FIGS. 3A-3D are circuit diagrams of diode NLTLs 300 for direct current (DC) mitigation according to alternative embodiments. The circuit of FIG. 3A is an example embodiment for use with a positive polarity excitation pulse. The circuit of FIG. 3B is a different embodiment with diodes connected in series opposite to each other to be used with a bipolar excitation waveform. The circuit in FIG. 3C is an example of an alternative embodiment having a DC biasing voltage source. The circuit in FIG. 3D is an example of an alternative embodiment having a DC biasing voltage source for the series of mutually coupled inductors 314, labeled $L_{C1}$ to $L_{CN}$.

As shown in FIGS. 3A-3C, the NLTL 300 comprises a plurality of inductive elements 302, labeled $L_1$ to $L_N$. In each of FIGS. 3A-3C, the inductive elements 302 comprise inductors electrically connected in series. In FIG. 3A and FIG. 3C, the capacitive elements 304 comprise shunt-connected diodes (e.g., varactors), and a plurality of nonlinear capacitive elements 304, labeled $D_1$ to $D_N$. In FIG. 3B, capacitive elements 304 comprise shunt-connected, series-opposing diodes (e.g., pairs of opposing varactors connected in series), labeled $D_{A1}$ to $D_{AN}$ and $D_{B1}$ to $D_{BN}$. The inductive elements 302 and capacitive elements 304 are arranged in a periodic structure forming a NLN, specifically NLTL 300. FIGS. 3A-3C also illustrate an excitation source 306, labeled $V_1$, which is configured to provide an excitation input to NLTL 300. The NLTL 300 provides an output waveform to a load 308, shown as a resistance labeled RL, which also has associated parasitic capacitance and inductance. The load 308 in FIGS. 3A-3C is shown as a resistor for simplicity and, without any loss of generality, indicates an RF transmitting element such as an antenna with an impedance having both real (resistance) and imaginary components (capacitance and inductance). The embodiment of FIG. 3C differs from the standard NLTL 300 by introduction of a staggered bias voltage source 310, labeled $V_2$, which is used to set bias voltage across the non-linear capacitance elements 304, labeled $D_1$ to $D_N$. The embodiment of FIG. 3D differs from the standard NLTL 300 by introduction of a coupled inductors 314, labeled $L_{C1}$ to $L_{CN}$, and a variable bias voltage source 312, labeled VB, which is used to set bias current across the primary coils of the mutually coupled inductors 314, labeled $L_{C1}$ to $L_{CN}$, changing the inductance of the coupled secondary coils. The load 308 in FIG. 3D is labeled $Z_L$ to indicate a more general case of complex impedance.

It is to be understood that the nonlinear capacitive elements 104, 204, 304 are embodied by solid-state structures, lumped-elements nonlinear capacitors, diodes, varactors, or the like. The solid-state structures also have some internal resistance and parasitic inductance.

The nonlinear capacitive elements 104, 204, 304 can be stacked in series and/or in parallel to achieve the desired voltage standoff and capacitance value. The nonlinear response of the capacitance of elements 104, 204, 304 with voltage, jointly with the inductive elements 102, 202, 302, 314 results in increased propagation speed of the input signal's higher magnitude components compared to the input signal's lower magnitude components. The superposition of components yields pulse sharpening (shorter risetime), damped oscillatory behavior, and soliton formation. In a frequency domain, the output waveform of the NLN is a superposition of the high-frequency content of interest (e.g., hundreds of MHz to ones of GHz), a low-frequency (LF) spectrum (out of bandwidth of interest), and DC component. The presence of the DC signal content is unwanted as it cannot be radiated. The LF signal out-of-band is undesirable and lowers the overall efficiency, and both, DC and LF require filtering out before the radiating element. The DC and out-of-band frequency content may exceed 75-85%. The present disclosure relates to a novel method and topology that has not been previously reported and leads to an enhanced and improved efficiency of NLNs relative to conventional NLNs in addition to other improved performance parameters as described herein.

Regarding the frequency range, the oscillation amplitude (depth of modulation) and total number of solitons generated can be increased by varying the nonlinearity and the number of stages of the NLTL. The conductive and the dielectric losses will dissipate much of the energy. The frequency of the propagation pulse depends on the inductance and capacitance values. In an embodiment employing a diode as the nonlinear capacitive element, the diode cut-off frequency is selected to be higher than the Bragg frequency for pulse propagation in the NLTL. The Bragg frequency is defined by:

$$f_B = 1/\pi\sqrt{LC(V)}$$

For high efficiency, the diode is selected to have a low series resistance $R_S$ and a large elastance swing S, which is the reciprocal of capacitance. A diode component with wide elastance range, i.e., a high $S_{max}/S_{min}$ ratio, has a higher cut-off frequency. The diode cut-off frequency is defined by:

$$f_C = S_{max} - S_{min}/2\pi R_S$$

Figure 4:
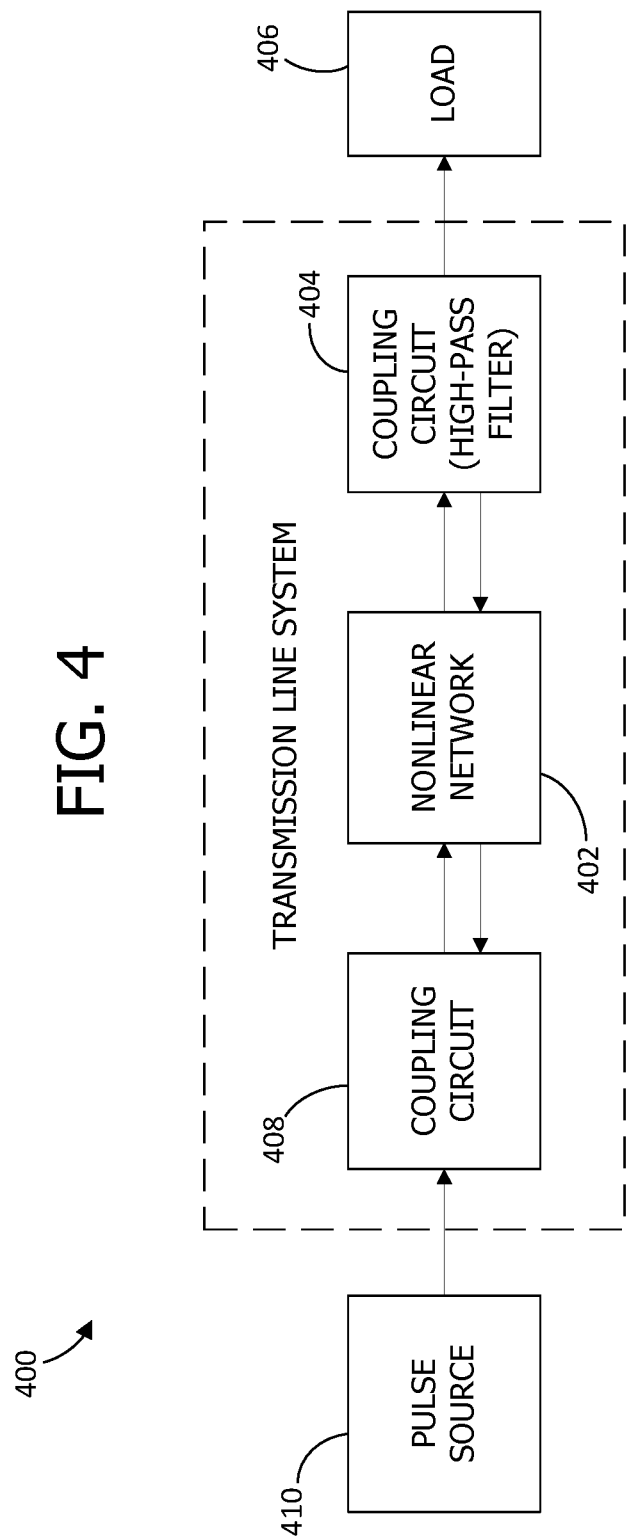
FIG. 4 is a block diagram of a multi-pass diode NLTL according to an embodiment.

Referring now to FIG. 4, a microwave generation system 400 embodying aspects of the present disclosure is shown. The system includes a NLN 402, such as one of the diode nonlinear transmission lines NLTL 100, NLTL 200, or NLTL 300. An output coupling circuit 404 is connected across an output of the NLN 402 and is configured to transmit high-frequency content of the transmission line's output to a load 406 (e.g., a transmitting antenna). In addition, the output coupling circuit 404 reflects back DC and LF content into the NLN 402. In one embodiment, output coupling circuit 404 comprises a high pass filter configured to provide a secondary function of matching impedance of the load 406 connected across the output of the high-pass filter. In this embodiment, load 406 comprises a transmitting antenna having appropriate bandwidth and impedance. The match impedance load has very minor reflections.

FIG. 4 further illustrates an input coupling circuit 408 connected across an input of NLN 402. The input coupling circuit 408 is configured to pass an excitation pulse from a pulse source 410 into NLN 402 and it is configurable to match the impedance of the excitation source. In addition, the input coupling circuit 408 cooperates with output coupling circuit 404 to repeatedly reflect waveforms having DC and LF content back and forth through NLN 402 a plurality of times and to reduce offset build-up. In this manner, the system 400, via output coupling circuit 404, transmits high-frequency (HF) content of the output waveform of NLN 402 to load 406 and reflects DC and LF content of the output waveform of NLN 402 back into NLN 402. The waveform propagates back through the NLTL, changes its form (time domain) and spectral content, and the input coupling circuit reflects back the reflected waveform. The input coupling circuit also provides matching of the source impedance.

The DC/LF signal content in this embodiment is reflected back to the input coupling circuit 408 (backward pass) and again toward the output coupling circuit 404 (forward pass). The NLN continues to modify the passing waveform by sharpening the front edges and increasing the peak amplitude of the LF oscillations, resulting in a net effect of more HF content that is transmitted from the output of the NLN 402 by the output coupling circuit 404 to the load 406. The propagation time of the waveform depends on the size of the NLN (number of LC pairs) and the topology implementation of the NLN. For example, a single pass propagation delay for a NLN with 20 LC pairs is approximately tens of nanoseconds, which results in generation at the load 406 of group of HF bursts with repetition rate hundreds of MHz for each excitation pulse from the source 410. The load 406 is a directly connected transmitting antenna, a coaxial cable (transmission line), or a consecutive pulse-forming network.

Figure 5:
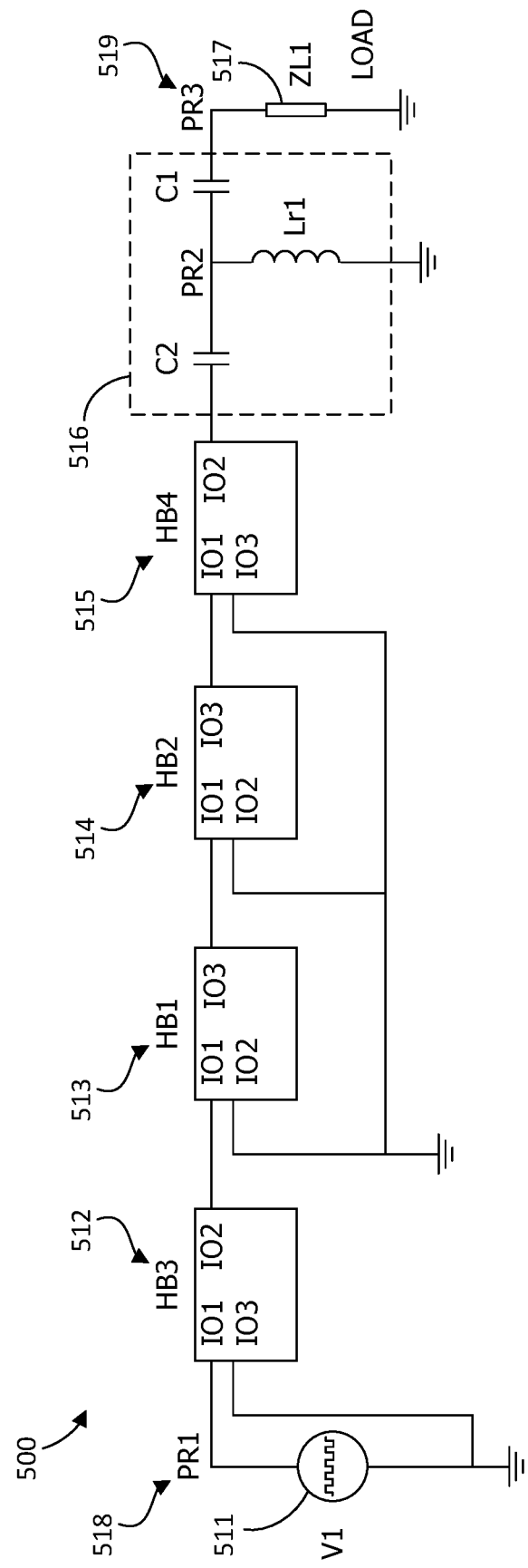
FIG. 5 is a circuit block diagram of the multi-pass diode NLTL of FIG. 4.

FIG. 5 is a circuit block diagram of the multi-pass diode NLTL 400 of FIG. 4. The circuit block-diagram displays a multi-pass NLN 500 as hierarchical blocks (HB) 512 to 515 in addition to as excitation source 511, a HPF 516, and a load 517. The HBs are subcircuits of the microwave generation system and display the method for embodiment of a multi-pass NLN. The HB 513 and 514 illustrate the scalability of the diode NLTL. The HB 512 is the input coupling circuit, and the HB 515 is the output coupling circuit. The assembly of three components 516, having additional wave-forming function, is a combination of two capacitive elements in series with a shunt inductance connected between the capacitors' junction point and ground. The PR1 probe 518 and PR3 probe 519 are displayed to illustrate the measurement points used to calculate the conversion efficiency of the multi-pass NLN.

Aspects of the present disclosure are embodied by electrical circuit topologies, and methods therefor, in which a coupling/decoupling network is included at each of the input and the output of NLN 402 (i.e., input coupling circuit 408 and output coupling circuit 404, respectively). In addition, output coupling circuit 404 comprises a high-pass filter (HPF). The HPF is configured to filter out low frequency components from the output to the load 406 as well as to provide an impedance matching transformer function. In this manner, the output of NLN 402 can be connected to load 406 with a desired impedance. The excitation source 410 for NLN 402 is connected to the input coupling sub-network 408 and the output of NLN 402 is connected to the output coupling sub-network 404 as shown in the illustrated embodiment. The output coupling sub-network 404 transmits the HF content and reflects back the DC and LF content of the signal. After a backward pass, the reflected signal is reflected again from the input coupling sub-network 408 resulting in a double-pass and modification of the DC and LF content, which produces additional HF content that is transferred through the HPF to the antenna and radiated. The net effect is a multi-pass of the input signal content until it is transformed into HF that can be transmitted. While the best reported radio-frequency conversion efficiency of diode-based NLTL in the literature is less than 25%, the present novel topology provides a conversion efficiency of the excitation pulse exceeding 60-70%.

In addition to reflecting DC and LF signal content, the input coupling circuit matches the impedance of the excitation source, and the output coupling circuit provides impedance matching with the load. In operation, the microwave generation system 400 provides a maximized conversion of the input signal and reduces the out-of-band frequencies by several orders of magnitude. Aspects of the present disclosure leverage the technological advantages of modern semiconductor-based excitation sources (mono- or bi-polar, photoconductive semiconductor switches, step recovery diodes and others) and provides the ability to use a shorter NLTL. The design and its implementation can be optimized for center frequency and spectral content distribution and for peak power at high repetition frequency. For example, several topologies using different combinations of inductor-diode pairs (NLN cells), multiple diodes stacked in series for high hold-off voltage, and different input excitation pulses are contemplated within the scope of the present disclosure. It should be noted that diodes are not the only way to construct a nonlinear capacitance. There are other NLN and/or NLTL embodiments that can be enhanced utilizing the novel topology described herein.

In an embodiment, the disclosed topologies of electrical drivers increase excitation pulse-to-RF conversion efficiency and overall system efficiency using methods that increase the overall and RF efficiency generation by re-utilizing the DC and the out-of-band LF content from the output of the NLN waveform reflected back by the output coupling circuit/filter. The output coupling circuit also provides impedance matching to the load. Mutually coupled inductor coils with controlled variable bias current in the primary coils provides ability to control the frequency propagating in the NLTL. Moreover, the disclosed topologies of electrical drivers provide an increased pulse repetition rate and are suitable for high-power microwave generation using mono-polar or bi-polar pulse excitation source. The disclosed topologies of electrical drivers also reduce the thermal load and thermal management requirements for the system. Multiple bursts of RF energy at very high repetition rate are generated for a single excitation pulse.

The microwave generation system 400 employing the disclosed electrical driver topology advantageously: increases efficiency of the NLN (overall and RF); provides multiple spectral lines with higher Power spectral density; is capable of high repetition rate of RF bursts generation; lower the thermal load on the system and permits easier thermal management; is suitable for use with different excitation sources, such as mono- or bi-polar pulse generators based on semiconductor technology (e.g., photoconductive semiconductor switches (PCSS), step recovery diodes (SRD), avalanche transistors, spark gap switches and others); matches output impedance of the NLN to the load (radiating antenna); is suitable for use with a distributed or a lumped-elements NLTL; requires a lower repetition rate and a lower overall power from the excitation source (e.g., laser source in the case of PCSS); lowers overall power from the DC (or pulsed) power source; can be optimized for spectral content and peak power; and reduces size, weight, and cost with higher energy conversion efficiency. Multiple modules based on the presented NLTL topology can be configured in parallel mode to deliver an increased power at a common load and can be used for electronic beam steering with a time-delay control of the excitation pulses and an array of radiating elements.

In an aspect, a transmission line (TL) topology comprises a plurality of series inductive elements and a plurality of capacitive elements. The inductive elements and the capacitive elements are arranged in a periodic structure of multiple inductor-capacitor pairs (LC pairs) forming a TL. When at least one of the elements has a non-linear characteristic with respect to voltage and current, the formed TL is known as NLTL. An output coupling circuit connected across an output of the NLN is configured to transmit frequency content of interest to a load (transmitting antenna) and to reflect back direct current and out of band frequency content back into the NLN.

A known use of a NLN is to convert a high-voltage pulse to high-frequency RF signal. In this aspect, the output coupling circuit is configured to operate as a high-pass filter, rejecting and reflecting back the spectral content below the passband of the coupling circuit. The output coupling circuits is connected to a load which, in general, is a radiating antenna with a complex impedance $Z_L$ (resistive, capacitive and inductive components).

A method of improving RF conversion in a NLTL embodies further aspects of the present disclosure. When a NLTL includes a plurality of series inductive elements and a plurality of nonlinear capacitive elements that are arranged in a periodic structure forming a NLN, it is known as a capacitive non-linear transmission line. When a NLTL includes a plurality of series non-linear inductive elements and a plurality of capacitive elements that are arranged in a periodic structure forming a NLN, it is known as an inductive non-linear transmission line. The general case is a network that embodies non-linear inductive and non-linear capacitive elements. When the non-linear capacitive element is a diode structure connected in reverse, the NLTL is commonly known as diode NLTL or DNLTL.

A method of the disclosure comprises connecting an output coupling circuit across an output of the NLN, coupling the NLN to a load, and transmitting the output signal of the NLTL with spectral content above the cut-off frequency of the coupling circuit to the load. The method also comprises reflecting, via the output coupling circuit, direct current and lower frequency content from the input of the coupling circuit back into the NLN.

In another aspect, an RF generation system comprises a plurality of series inductive elements and a plurality of shunt nonlinear capacitive elements. The inductive elements and the capacitive elements are arranged in a periodic structure forming a NLTL. A source is configured to the input of the NLTL to provide an excitation waveform with short rise time and high peak amplitude to an input of the NLTL. The pulse has a broad spectral content from DC, for monopolar waveforms, to high frequency with upper limit related to the rise time of the waveform in time domain. The system also comprises an output coupling circuit connected across an output of the NLTL. The output coupling circuit is configured to transmit the high-frequency content to a load and to reflect back the low-frequency content into the N LTL.

Although U.S. Pat. No. 10,666,198, which discloses using NLTL with a feedback for recirculating or reutilizing the DC and LF, purports to improve overall conversion efficiency, the use of feedback involves a delay line that involves complexity of implementation. Aspects of the present disclosure eliminate these constraints providing efficiency exceeding several times any previously reported. The delay line of this reference does not modify the waveform propagating back to the input of the NLN and result in a repeated single forward pass. The present disclosure provides repeated double backward-forward passes during which part of the waveform's DC/LF content is transformed to HF.

U.S. Pat. No. 9,900,203 discloses the use of nonlinear modules for generating high power pulses including the means for lowering the DC content of the generated signal. But such disclosure is limited to the use of photoconductive semiconductor switches and the modules generate out-of-band, LF content with spectral magnitude that is several times higher than that of the HF content. This reference requires an excitation pulse for every output HF burst that it generates. The topology presented herein is superior with respect to the process of DC pulse to in-band RF conversion, the efficiency of the conversion, repetition reat, and thermal management.

When introducing elements of aspects of the disclosure or the embodiments thereof, the articles "a", "an", "the" and "said" are intended to mean that there are one or more of the elements. The terms "comprising", "including", and "having" are intended to be inclusive and mean that there may be additional elements other than the listed elements.

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A nonlinear transmission line topology comprising:
a plurality of series inductive elements;
a plurality of nonlinear capacitive elements, the inductive elements and the capacitive elements arranged in a periodic structure forming a nonlinear network; and
an output coupling circuit connected across an output of the nonlinear network configured to transmit high-frequency content to a load and to reflect back direct current and low-frequency content into the nonlinear network.

2. The nonlinear transmission line topology of claim 1, wherein the series inductive elements comprise inductors electrically connected in series.

3. The nonlinear transmission line topology of claim 1, wherein the nonlinear capacitive elements comprise at least one of the following: solid-state structures and lumped-elements nonlinear capacitors.

4. The nonlinear transmission line topology of claim 1, wherein the nonlinear capacitive elements comprise diodes.

5. The nonlinear transmission line topology of claim 4, wherein the diodes comprise varactors.

6. The nonlinear transmission line topology of claim 1, wherein the output coupling circuit comprises a high-pass filter.

7. The nonlinear transmission line topology of claim 6, wherein the high-pass filter comprises a secondary function of matching impedance of the load connected across the output of the high-pass filter.

8. The nonlinear transmission line topology of claim 1, further comprising an input coupling circuit connected across an input of the nonlinear network, the input coupling circuit configured to pass an excitation pulse and reflect waveforms having direct current and lower frequency content forward into the nonlinear network a plurality of times and to reduce offset build-up.

9. A method of improving radio frequency conversion in a nonlinear transmission line (NLTL), the NLTL comprising a plurality of series inductive elements and a plurality of nonlinear capacitive elements, the inductive elements and the capacitive elements arranged in a periodic structure forming a nonlinear network, the method comprising:
connecting an output coupling circuit across an output of the nonlinear network;
coupling the nonlinear network to a load;
transmitting, via the output coupling circuit, high-frequency content of a radio frequency (RF) signal from the output of the nonlinear network to the load; and
reflecting, via the output coupling circuit, direct current and lower frequency content from the load back into the nonlinear network.

10. The method of claim 9, wherein the output coupling circuit comprises a high-pass filter, and further comprising:
filtering, by the high-pass filter, the RF signal from the output of the nonlinear network.

11. The method of claim 10, further comprising:
matching, by the high-pass filter, impedance of the load connected across the output of the high-pass filter.

12. The method of claim 9, further comprising:
connecting an input coupling circuit across an input of the nonlinear network; and
repeatedly passing back and forth, by the input coupling circuit and the output coupling circuit, waveforms having direct current and lower frequency content.

13. A radio frequency (RF) generation system comprising:
a plurality of series inductive elements;
a plurality of shunt nonlinear capacitive elements, the inductive elements and the capacitive elements arranged in a periodic structure forming a nonlinear transmission line;
an excitation source configured to provide an excitation pulse waveform to an input of the nonlinear transmission line, the pulse waveform comprising high-frequency content and low-frequency content; and
an output coupling circuit connected across an output of the nonlinear transmission line, the output coupling circuit configured to transmit the high-frequency content to a load and to reflect back the low-frequency content into the nonlinear transmission line.

14. The RF generation system of claim 13, wherein the series inductive elements comprise inductors electrically connected in series.

15. The RF generation system of claim 14, wherein the inductors each have controllable inductance and are configured for simultaneous control of the inductance to control a center frequency of the transmitted waveform.

16. The RF generation system of claim 13, wherein the shunt nonlinear capacitive elements comprise at least one of the following: solid-state structures, lumped-elements nonlinear capacitors, diodes, and varactors.

17. The RF generation system of claim 13, wherein the output coupling circuit connected across the output of the nonlinear transmission line comprises a high-pass filter.

18. The RF generation system of claim 17, wherein the high-pass filter comprises a secondary function of matching impedance of the load connected across an output of the high-pass filter.

19. The RF generation system of claim 13, further comprising an input coupling circuit connected across an input of the nonlinear transmission line, the input coupling circuit configured to pass an excitation pulse from the excitation source and to reflect waveforms forward into the nonlinear transmission line.

20. The RF generation system of claim 19, wherein the reflected waveforms passed back and forth in the nonlinear transmission line comprise the low-frequency content and direct current content.

21. The RF generation system of claim 13, wherein the output coupling circuit is further configured to reflect back direct current content into the nonlinear transmission line.

22. The RF generation system of claim 13, wherein the output coupling circuit is further configured to control a bandwidth of the high-frequency content transmitted to the load.

23. The RF generation system of claim 13, wherein the series inductive elements are mutually coupled coils configured to control a center frequency of the high-frequency content transmitted to the load.

* * * * *